US010506733B2

(12) United States Patent
Gridish et al.

(10) Patent No.: US 10,506,733 B2
(45) Date of Patent: Dec. 10, 2019

(54) INTERNALLY WIRELESS DATACENTER RACK

(71) Applicant: Mellanox Technologies, Ltd., Yokneam (IL)

(72) Inventors: Yaakov Gridish, Yoqneam Ilit (IL); Elad Mentovich, Tel Aviv (IL); Eitan Zahavi, Zichron Yaakov (IL); Sylvie Rockman, Zichron Yaakov (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 0 days.

(21) Appl. No.: 15/717,399

(22) Filed: Sep. 27, 2017

(65) Prior Publication Data
US 2019/0098793 A1 Mar. 28, 2019

(51) Int. Cl.
*H05K 7/14* (2006.01)
*H04B 7/24* (2006.01)

(52) U.S. Cl.
CPC ............. *H05K 7/1492* (2013.01); *H04B 7/24* (2013.01)

(58) Field of Classification Search
CPC ................................ H05K 7/1492; H04B 7/24
USPC .......................................................... 361/724
See application file for complete search history.

(56) References Cited

U.S. PATENT DOCUMENTS

| 7,715,867 | B2 * | 5/2010 | He ........................... H04B 1/38 455/550.1 |
| 8,416,834 | B2 | 4/2013 | DeCusatis et al. |
| 8,417,861 | B2 | 4/2013 | Rofougaran et al. |
| 8,457,174 | B2 | 6/2013 | DeCusatis et al. |
| 9,281,904 | B2 * | 3/2016 | Wellbrock ........... H04B 10/801 |
| 9,286,121 | B2 | 3/2016 | Rofougaran et al. |
| 9,391,716 | B2 | 7/2016 | Shin et al. |
| 2006/0211449 | A1 | 9/2006 | Haque et al. |
| 2009/0142065 | A1 | 6/2009 | Kreusser |
| 2009/0219536 | A1 * | 9/2009 | Piazza ....................... G01S 5/16 356/445 |
| 2010/0172292 | A1 * | 7/2010 | Ramachandran ..... H04W 84/10 370/328 |
| 2011/0228779 | A1 * | 9/2011 | Goergen ................. H04L 49/40 370/392 |
| 2011/0243074 | A1 * | 10/2011 | Shin ..................... H04B 10/803 370/329 |

(Continued)

FOREIGN PATENT DOCUMENTS

WO WO-2016/0130227 A1 8/2016

*Primary Examiner* — Rockshana D Chowdhury
(74) *Attorney, Agent, or Firm* — Alston & Bird LLP

(57) ABSTRACT

An internally wireless datacenter rack configured to support datacenter computing equipment is provided. The datacenter rack includes a housing configured to receive a first networking box including a printed circuit board assembly and one or more wireless connectors in electrical communication with the printed circuit board assembly. The housing includes a second networking box including a printed circuit board assembly and one or more wireless connectors in electrical communication with the printed circuit board assembly. The one or more wireless connectors convert between electrical signals and optical signals. The datacenter rack includes a wireless free space region within the housing, and the wireless free space region includes a wireless reflective backplane that allows free space wireless communication between the first networking box and the second networking box.

7 Claims, 8 Drawing Sheets

(56) References Cited

U.S. PATENT DOCUMENTS

| | | |
|---|---|---|
| 2011/0317743 A1 | 12/2011 | DeCusatis et al. |
| 2012/0311127 A1* | 12/2012 | Kandula ............... H04W 16/28 709/224 |
| 2015/0071646 A1* | 3/2015 | Jau ....................... H04B 10/803 398/128 |
| 2015/0085903 A1* | 3/2015 | Gundel ............... H05K 1/0239 375/219 |
| 2016/0173199 A1 | 6/2016 | Gupta et al. |
| 2016/0234960 A1 | 8/2016 | Masuyama et al. |
| 2016/0269309 A1* | 9/2016 | Shin .................... H04B 10/803 |

* cited by examiner

INTERNALLY WIRELESS DATACENTER RACK

BACKGROUND

The present disclosure relates in general to communication systems used in datacenters including datacenter switch systems, networking boxes, modules, and other optical and electrical components. In particular, embodiments of the present disclosure described herein may be configured to provide an internally wireless datacenter rack to increase performance of datacenter networked connections while reducing the time and financial cost associated with traditional wired connections.

Datacenters and associated switch systems often use datacenter racks containing networking boxes to connect or otherwise form communication systems. Traditionally, these networking boxes were connected to one another within the same datacenter rack and potentially connected to other networking boxes in separate racks via wired connections. Conventional attempts at producing a wireless communication system in a datacenter have focused on replacing the wired connections between datacenter racks in favor of wireless communication techniques. However, such conventional attempts fail to reduce the costs and improve the performance of connections located within a datacenter rack. The inventors have identified numerous other deficiencies with existing technologies in the field, the remedies for which are the subject of the embodiments described herein.

BRIEF SUMMARY

Accordingly, the apparatuses and associated systems described herein provide an internally wireless datacenter rack configured to support datacenter computing equipment. The datacenter rack may include a housing configured to receive a first networking box including a printed circuit board assembly and one or more wireless connectors in electrical communication with the printed circuit board assembly. The one or more wireless connectors may be configured to convert between electrical signals and wireless signals and may be configured to transmit and receive wireless signals. The housing may receive a second networking box including a printed circuit board assembly and one or more wireless connectors in electrical communication with the printed circuit board assembly. The one or more wireless connectors may be configured to convert between electrical signals and wireless signals and may be configured to transmit and receive wireless signals. The internally wireless datacenter rack may include a wireless free space region disposed within the housing including a wireless reflective backplane configured to allow free space wireless communication between the one or more wireless connectors disposed on the first networking box and the one or more wireless connectors disposed on the second networking box.

In some embodiments, in an instance in which the first and second networking boxes are received within the housing, the wireless free space region may be disposed adjacent the one or more wireless connectors.

In other embodiments, the housing may further define a backplane wall and at least one support wall, wherein in an instance in which the first and second networking boxes are received within the housing, the support wall may be located a first distance from the first networking box and the second networking box, and the backplane wall may be located opposite the one or more wireless connectors at a second distance from the first networking box and the second networking box, wherein the second distance may be larger than the first distance.

In some cases, the wireless reflective backplane may be disposed on the backplane wall of the housing.

In other cases, the wireless free space region may further define a wireless waveguide configured to facilitate wireless communication between at least one of the one or more wireless connectors disposed on the first networking box and a corresponding one of the one or more wireless connectors disposed on the second networking box.

In some further embodiments, the wireless reflective backplane may include one or more wireless antennas.

In some cases, the one or more wireless connectors of the first networking box and the one or more wireless connectors of the second networking box may include one or more transceiver assemblies configured to convert between optical signals and electrical signals.

In other cases, the first networking box and the second networking box include one or more board to board connectors.

In other embodiments, an internally wireless datacenter rack configured to support datacenter computing equipment is provided. The datacenter rack includes a housing configured to receive at least a first networking box including a printed circuit board assembly and one or more wireless connectors in electrical communication with the printed circuit board assembly. The one or more wireless connectors may be configured to convert between electrical signals and wireless signals and may be configured to transmit and receive wireless signals. The housing may receive a second networking box including a printed circuit board assembly and one or more wireless connectors in electrical communication with the printed circuit board assembly. The one or more wireless connectors may be configured to convert between electrical signals and wireless signals and may be configured to transmit and receive wireless signals. The internally wireless datacenter rack may include a wireless free space region disposed within the housing including one or more wireless waveguides configured to connect between the one or more wireless connectors disposed on the first networking box and the one or more wireless connectors disposed on the second networking box and configured to enable wireless signals to be transmitted therebetween.

In some embodiments, in an instance in which the first and second networking boxes are received within the housing, the wireless free space region may be disposed adjacent the one or more wireless connectors.

In other embodiments, the one or more wireless waveguides may include millimeter wave over plastic structures.

In some cases, the wireless free space region includes one or more wireless reflective backplane elements configured to direct wireless signals between the one or more wireless connectors disposed on the first networking box and the one or more wireless connectors disposed on the second networking box.

In other cases, each wireless reflective backplane element may be disposed between at least two wireless waveguides.

In some further embodiments, the one or more wireless connectors of the first networking box and the one or more wireless connectors of the second networking box further may include one or more transceiver assemblies configured to convert between optical signals and electrical signals.

In some still further cases, the first networking box and the second networking box may include one or more board to board connectors.

In other embodiments, an internally wireless datacenter rack configured to support datacenter computing equipment is provided. The datacenter rack includes a housing configured to receive at least a first networking box including a printed circuit board assembly and one or more wireless connectors in electrical communication with the printed circuit board assembly. The one or more wireless connectors may be configured to convert between electrical signals and wireless signals and may be configured to transmit and receive wireless signals. The housing may receive a second networking box including a printed circuit board assembly and one or more wireless connectors in electrical communication with the printed circuit board assembly. The one or more wireless connectors may be configured to convert between electrical signals and wireless signals and may be configured to transmit and receive wireless signals. The internally wireless datacenter rack may include a wireless free space region disposed within the housing including one or more wireless antennas disposed within the wireless free space region. In an instance in which the first and second networking boxes are received within the housing, the one or more wireless connectors disposed on the first networking box and the one or more wireless connectors disposed on the second networking box may be configured to communicate wireless signals therebetween via the wireless free space region and the one or more wireless antennas.

In some embodiments, in an instance in which the first and second networking boxes are received within the housing, the wireless free space region may be disposed adjacent the one or more wireless connectors.

In some cases, the wireless signals may be WiFi radio waves, mmWave waves, or THz wireless.

In other cases, the first networking box and the second networking box may include one or more transceiver assemblies configured to convert between optical signals and electrical signals.

In some other embodiments, the first networking box and the second networking box further include one or more board to board connectors.

BRIEF DESCRIPTION OF THE SEVERAL VIEWS OF THE DRAWING(S)

Having thus described the disclosure in general terms, reference will now be made to the accompanying drawings, which are not necessarily drawn to scale, and wherein:

DETAILED DESCRIPTION OF THE DRAWINGS

Overview

The present invention now will be described more fully hereinafter with reference to the accompanying drawings in which some but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, terms such as "front," "rear," "top," etc. are used for explanatory purposes in the examples provided below to describe the relative position of certain components or portions of components. As used herein, the term "datacenter rack" may include datacenter cabinets, networking cabinets, server racks, and the like and may encompass any structure configured to support networking system and/or communication equipment.

Datacenters and other communication related systems are often configured with a plurality of datacenter racks or cabinets housing a plurality of networking boxes/servers within each rack. As a result, the physical space required to house a large number of datacenter racks, due to the number of networking components necessary to provide an effective communication system, is immense. Accordingly, design of networking components used in datacenters often attempts to reduce they physical footprint of the datacenter rack. However, reduction of the size of a datacenter rack may result in negative effects to the networking equipment disposed within the rack. In particular, due to the size and number of wired connections used within a traditional datacenter rack, a reduction of space within such a traditional wired rack may require removable of entire networking boxes or switch systems.

As noted, traditional datacenter racks rely upon internal wired connections between networking boxes that require a large amount of space within a datacenter rack. Such connections make the modification of components connected within the datacenter rack cumbersome. For example, if a particular networking box fails during operation, each wired connection with the failed networking box must be removed to allow that the failed box to be replaced. However, as described hereinafter, the use of wireless connections within a datacenter rack according to embodiments of the present application may operate to reduce the time required to replace networking boxes within the datacenter rack as well as reduce costs associated with expensive wired components (e.g., optical fibers, couplers, and the like). Accordingly, embodiments of the present disclosure may provide for a wireless free space region accommodating internal wireless communication.

Figure 1:
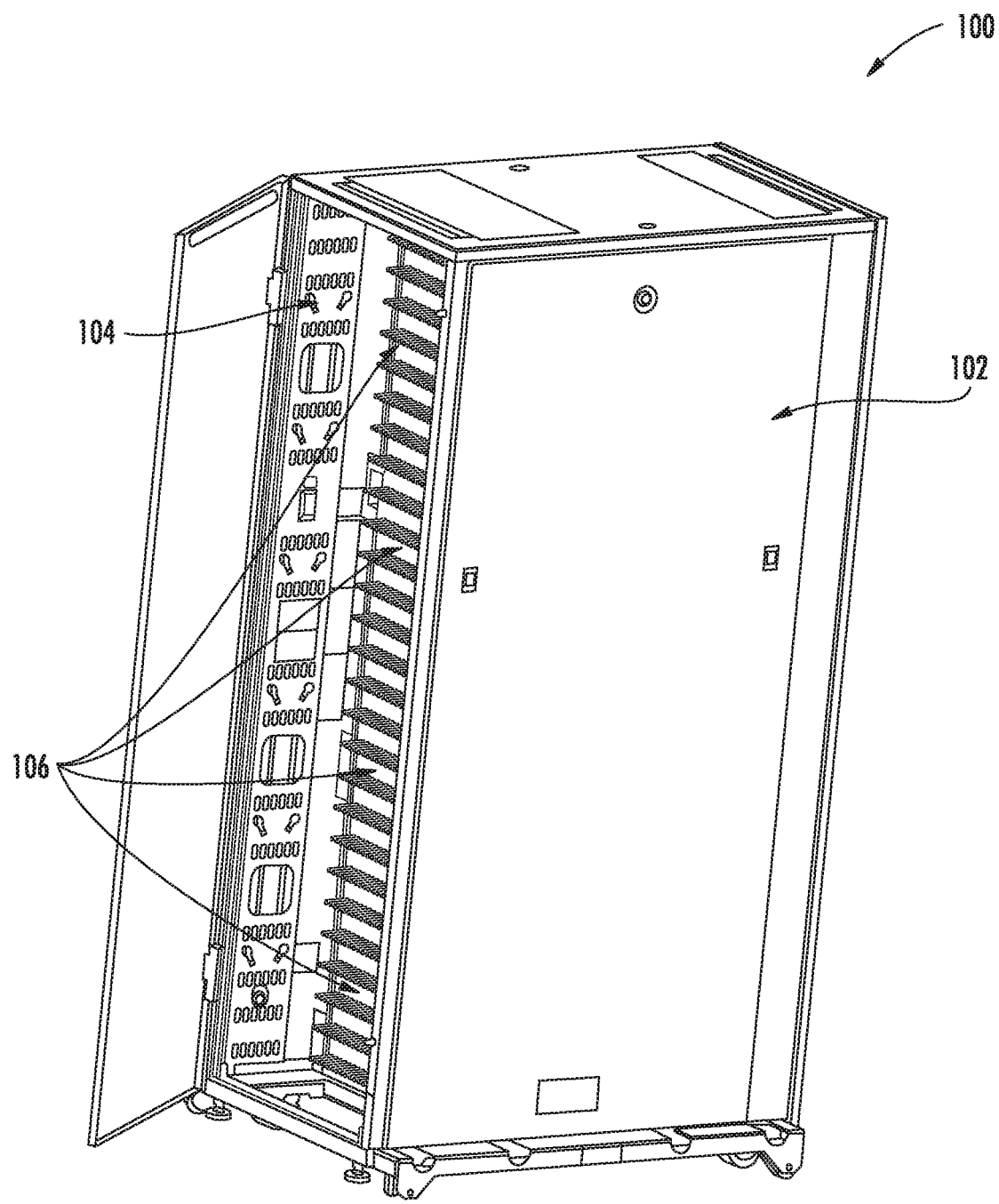
FIG. 1 is a perspective view of an internally wireless datacenter rack for use in accordance with some embodiments discussed herein.
Figure 2:
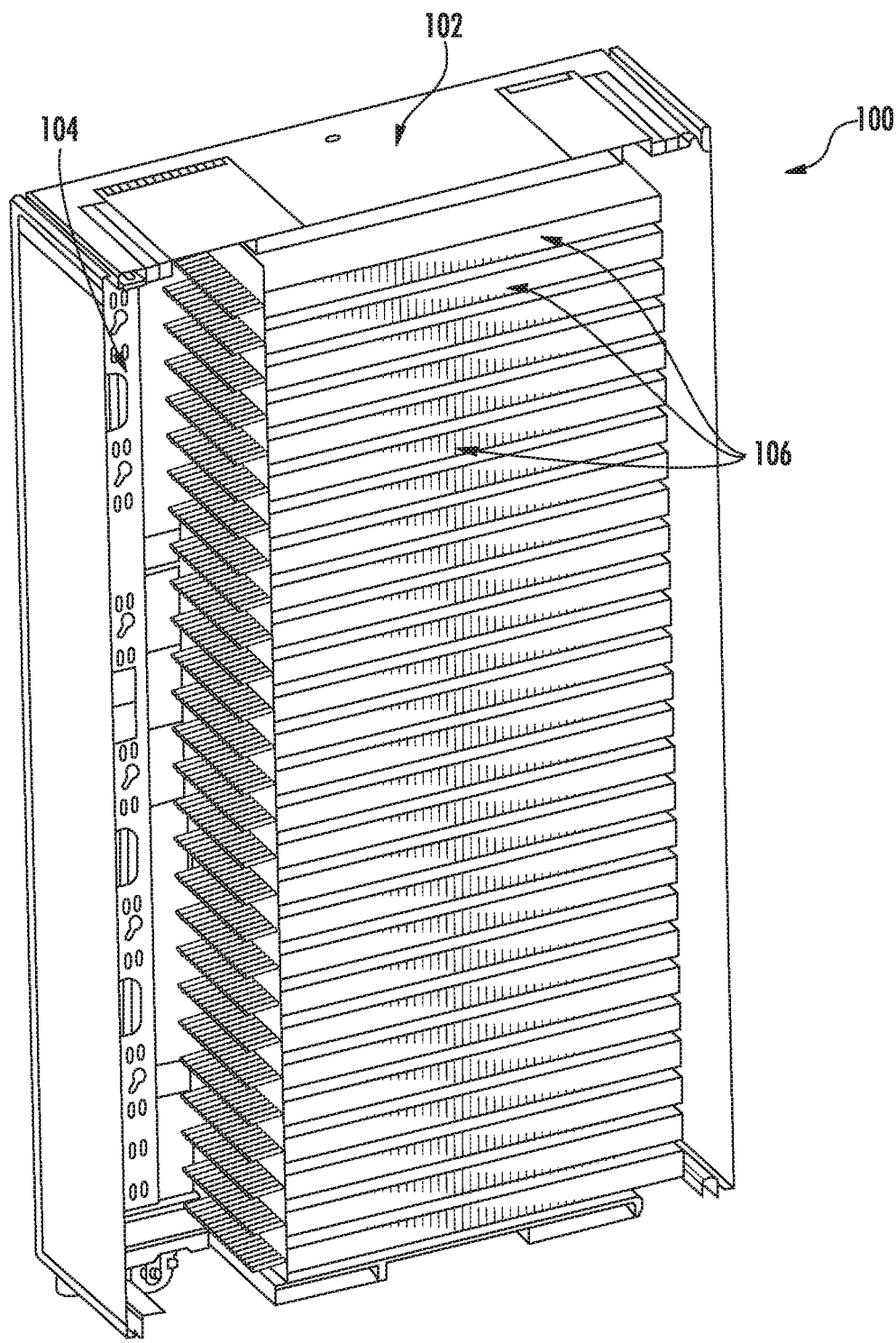
FIG. 2 is a perspective cut away view of the internally wireless datacenter rack of FIG. 1 according to an example embodiment.

With reference to FIGS. 1-2, an internally wireless datacenter rack 100 is illustrated. The internally wireless datacenter rack 100 may define a housing 102 configured to support networking boxes 106 therein. The internally wireless datacenter rack 100 may further comprise a wireless free space region disposed within the housing 102. As will be discussed hereinafter with reference to FIGS. 3-8, the wireless free space region 104 may be configured to accommodate various means for wireless communication. Although described herein with reference to a first networking box and second networking box (e.g., first networking box 302 and second networking box 306 in FIG. 3, respectively), the present disclosure contemplates that any number of networking boxes 106 may be located within the housing 102. In particular, with reference to FIG. 2, the cut away view illustrates that the networking boxes 106 are distinct elements which may be independently removed and/or replaced within the housing 102. Further, the present disclosure contemplates that the dimensions associated with the housing 102 may be configured to accommodate networking boxes 106 of varying dimensions as well as configured to adjust the size of the wireless free space region 104 based upon the wireless communication (e.g., elements, protocol, connections, etc.) chosen for the intended application of the datacenter rack 100.

Figure 3:
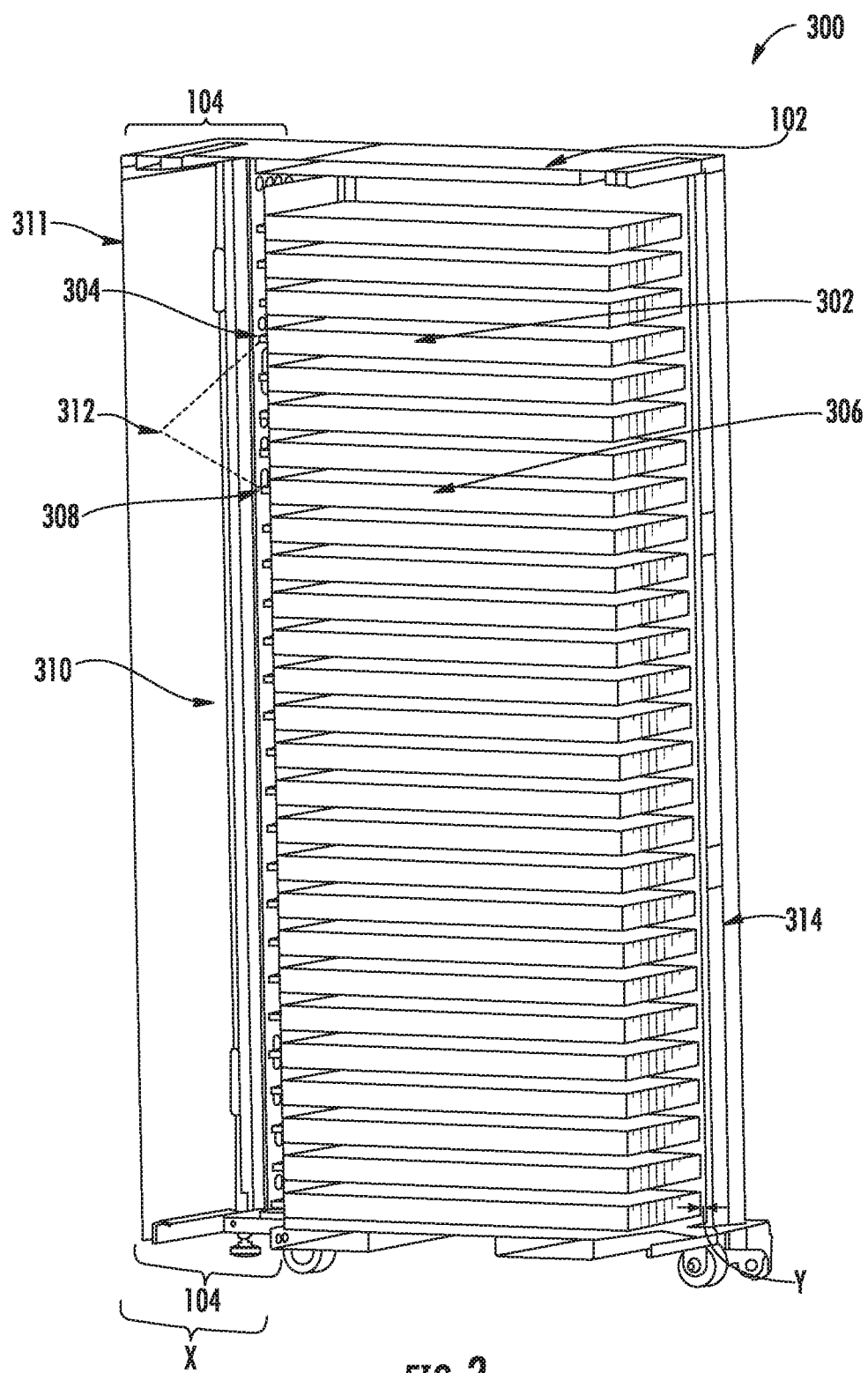
FIG. 3 is a perspective cut away view of an internally wireless datacenter rack including a wireless reflective backplane according to an example embodiment.

With reference to FIG. 3, an internally wireless datacenter rack including a wireless backplane (e.g., rack 300) is illustrated. The rack 300 may include a first networking box 302 and a second networking box 306 within the housing 102. Each networking box may contain various networking and communication elements disposed within each respective networking box. For example, the networking boxes may each include a printed circuit board assembly configured to transmit and receive electrical signals. Each networking box may further include one or more wireless connectors in electrical communication with the printed circuit board assembly of the respective networking box. As shown in FIG. 3, the first networking box 302 may include a first wireless connector 304 and the second networking box 306 may include a second wireless connector 308. As would be known by one of ordinary skill in the art in light of the present disclosure, the one or more wireless connectors (e.g., first wireless connector 304 and second wireless connector 308) may include one or more transceiver assemblies configured to convert between wireless signals and electrical signals. By way of example, the first wireless connector 304 may receive a wireless signal, discussed further hereinafter, and may (e.g., via an antenna system or the like) convert the received wireless signal to a corresponding electrical signal. The first wireless connector 304 may transmit this electrical signal to the printed circuit board assembly of the first networking box 302. Similarly, the first wireless connector 304 may receive an electrical signal from the first networking box 302 and convert (e.g., via an antenna system or the like) the electrical signal to a corresponding wireless signal.

The rack 300 may further include a wireless free space region 104 disposed within the housing 102. The wireless free space region 104, as mentioned above and described more fully with each embodiment herein, may be configured to facilitate internal wireless communication (e.g., communication between networking boxes 106 within a particular rack 100) within any combination of the datacenter rack embodiments contained herein. The wireless free space region 104 may be dimensioned (e.g., via the sizing of the housing 102) such that various wireless communication elements, connectors, or the like may be disposed within the wireless free space region 104. In some embodiments, the wireless free space region 104 may be disposed adjacent the one or more wireless connectors (e.g., the first wireless connector 304 and the second wireless connector 308) of the rack 300.

As shown in FIG. 3, the wireless free space region 104 may include a wireless reflective backplane 310 configured to allow free space wireless communication between the one or more wireless connectors (e.g., the first wireless connector 304) disposed on the first networking box 302 and the one or more wireless connectors (e.g., the second wireless connector 308) disposed on the second networking box 306. In some embodiments, the housing 102 may further define a backplane wall 311 supporting the wireless reflective backplane 310 and at least one support wall 314 such that the support wall 314 is located a first distance ("x") from the first networking box 302. At the same time, the second networking box 306 and the backplane wall 311 may be located opposite the one or more wireless connectors (e.g., the first wireless connector 304 and the second wireless connector 308) at a second distance ("y") from the first networking box 302 and the second networking box 306. In such an embodiment, the second distance ("x") may larger than the first distance ("y"). Said another way and illustrated by FIG. 3, the wireless reflective backplane 310 may be located opposite the one or more wireless connectors further away from the wireless connectors (as shown) than the wall on the opposite side of the housing 102 (e.g., support wall 314). Additionally, in some embodiments, as shown in FIG. 3, the wireless reflective backplane 310 may be disposed on the backplane wall 311 of the housing 102.

As described above, the wireless reflective backplane 310 of the wireless free space region 104 may allow for free space wireless communication between networking boxes housed by the rack 300. For example, the first networking box 302 may (e.g., via a printed circuit board assembly contained therein) transmit an electrical signal to the first wireless connector 304. The first wireless connector 304 may convert the electrical signal to a corresponding wireless signal 312 for transmission. The wireless signal 312 may be emitted by the first wireless connector 304 and be directed by the wireless reflective backplane 310 (e.g., reflected or otherwise transmitted) to the second wireless connector 308. Similarly, the second wireless connector 308 may convert the wireless signal 312 to a corresponding electrical signal for use by the second networking box 306. In some embodiments discussed hereinafter (e.g., with reference to FIGS. 6-7), the wireless reflective backplane 310 may further include one or more wireless antennas configured to facilitate (e.g., adjust or maintain) the direction of the wireless signal 312. Similarly, in some embodiments discussed hereinafter (e.g., with reference to FIGS. 4-5), the wireless reflective backplane 310 may further include one or more wireless waveguides configured to facilitate direction of the wireless signal 312.

Figure 4:
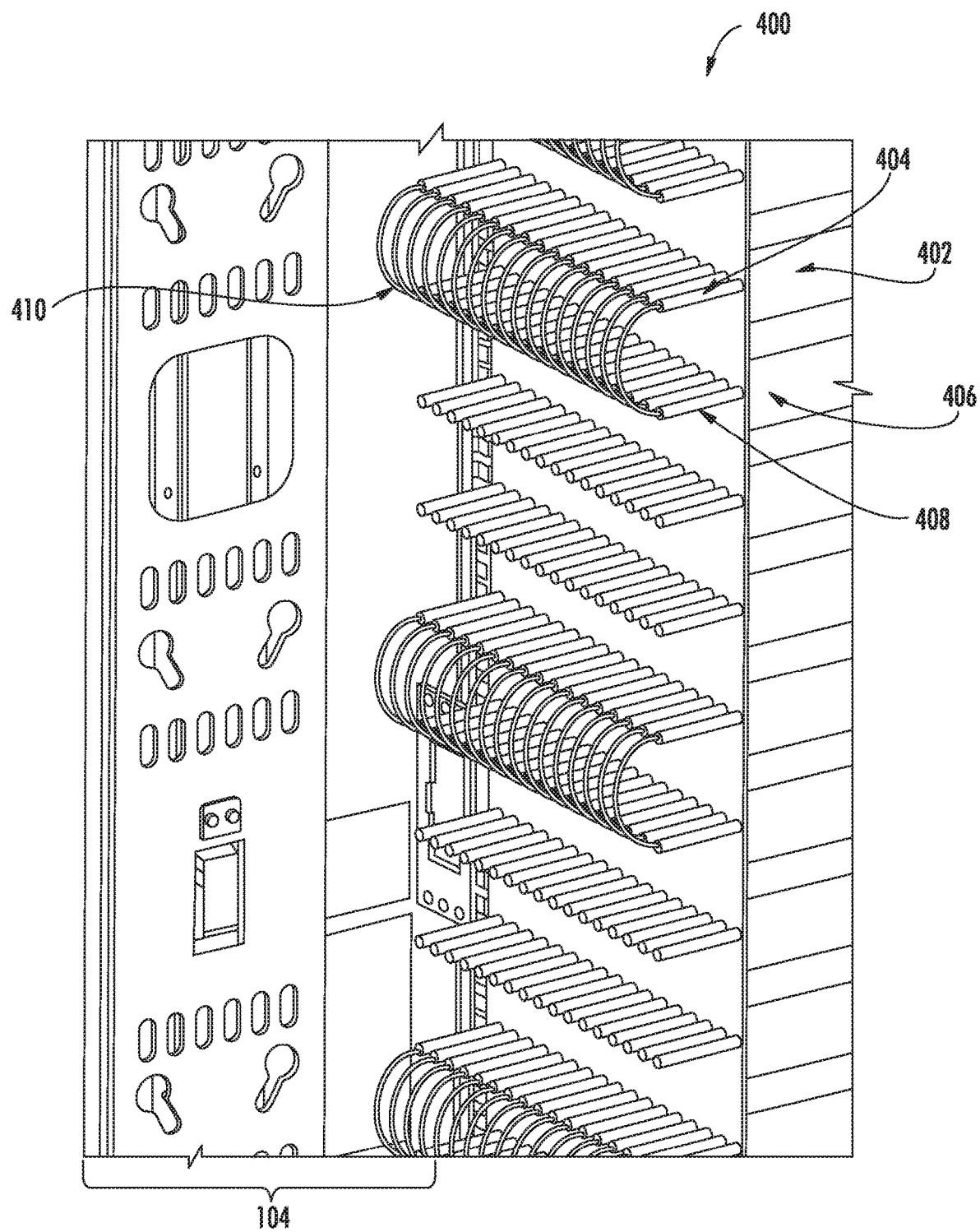
FIG. 4 is a perspective cut away view of an internally wireless datacenter rack including wireless waveguides according to an example embodiment.
Figure 5:
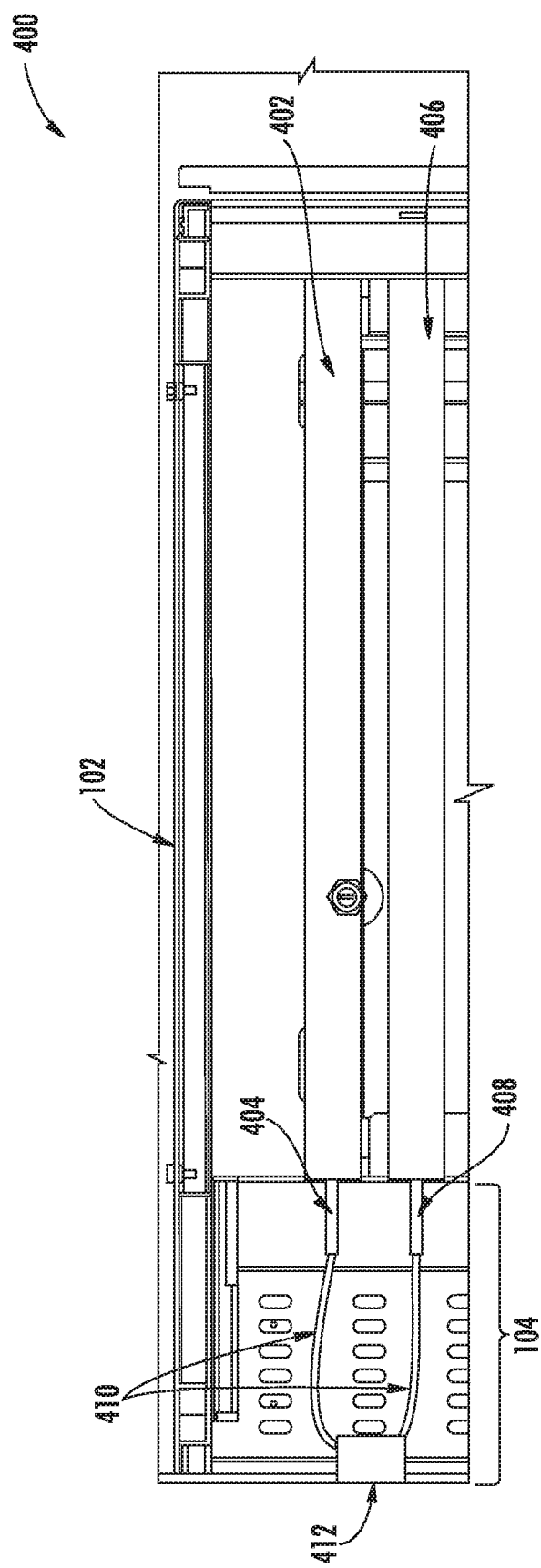
FIG. 5 is a side cut away section view of the internally wireless datacenter rack of FIG. 4 including a wireless reflective backplane element according to an example embodiment.

With reference to FIGS. 4-5, an internally wireless datacenter rack including wireless waveguides (e.g., rack 400) is illustrated. The rack 400 may include a first networking box 402 and a second networking box 406 within the housing 102. As described above with reference to FIG. 3, each networking box may contain various networking and communication elements disposed within each respective networking box. For example, the networking boxes may each include a printed circuit board assembly configured to transmit and receive electrical signals. Each networking box may further include one or more wireless connectors in electrical communication with the printed circuit board assembly of the respective networking box. As shown in FIGS. 4-5 and also described above, the first networking box 402 may include a first wireless connector 404 and the second networking box 406 may include a second wireless connector 408. As would be known by one of ordinary skill in the art in light of the present disclosure, the one or more wireless connectors (e.g., first wireless connector 404 and second wireless connector 408) may include one or more antenna assemblies configured to convert between wireless signals and electrical signals.

As shown in FIGS. 4-5, the wireless free space region 104 may include one or more wireless waveguides 410 configured to connect between the one or more wireless connectors disposed on the first networking box 402 and the one or more wireless connectors disposed on the second networking box 406. The wireless waveguides may be configured to enable wireless signals to be transmitted between networking boxes. The one or more wireless waveguides 410 may, in some embodiments, comprise mmWave over plastic structures (e.g., plastic straw or the like). As would be understood by one of ordinary skill in the art in light of the present disclosure, the wireless waveguides 410 may operate to enclose or otherwise bound a wireless signal received from the one or more wireless connectors (e.g., first wireless connector 404 and second wireless connector 408). For example, the first networking box 402 may (e.g., via a printed circuit board assembly contained therein) transmit an electrical signal to the first wireless connector 404. The first wireless connector 404 may convert the electrical signal to a corresponding wireless signal for transmission. The wireless signal may be emitted by the first wireless connector 404 and be directed by the wireless waveguide structure 410 to the second wireless connector 408. Similarly, the second wireless connector 408 may convert the wireless signal to a corresponding electrical signal for use by the second networking box 406.

In some embodiments, with reference to FIG. 5, the rack 400 may include one or more wireless reflective backplane elements 412 in the wireless free space region 104. These wireless reflective backplane elements 412 may be configured to direct wireless signals between the one or more wireless connectors disposed on the first networking box 402 and the one or more wireless connectors disposed on the second networking box 406. Further, and as shown in FIG. 5, each wireless reflective backplane element 412 may be disposed between at least two wireless waveguides 410. As described above with reference to FIG. 3, a wireless reflective backplane element 412 may operate similar to the wireless reflective backplane 310 of FIG. 3 by directing wireless signals. By way of example, the embodiment illustrated in FIG. 5 may be used in situations where complicated geometry or other physical blockage limits the use of wireless waveguides alone. In such an example, the wireless reflective backplane element 412 may be used in conjunction with the wireless waveguides 410 to allow wireless communication between the one or more wireless connectors. Examples of components which may be incorporated into a wireless reflective backplane element (e.g., wireless reflective backplane elements 412 of FIG. 5) for use in some embodiments of the present disclosure may be found in U.S. patent application Ser. No. 15/586,589, the disclosure of which is hereby incorporated by reference in its entirety.

Figure 6:
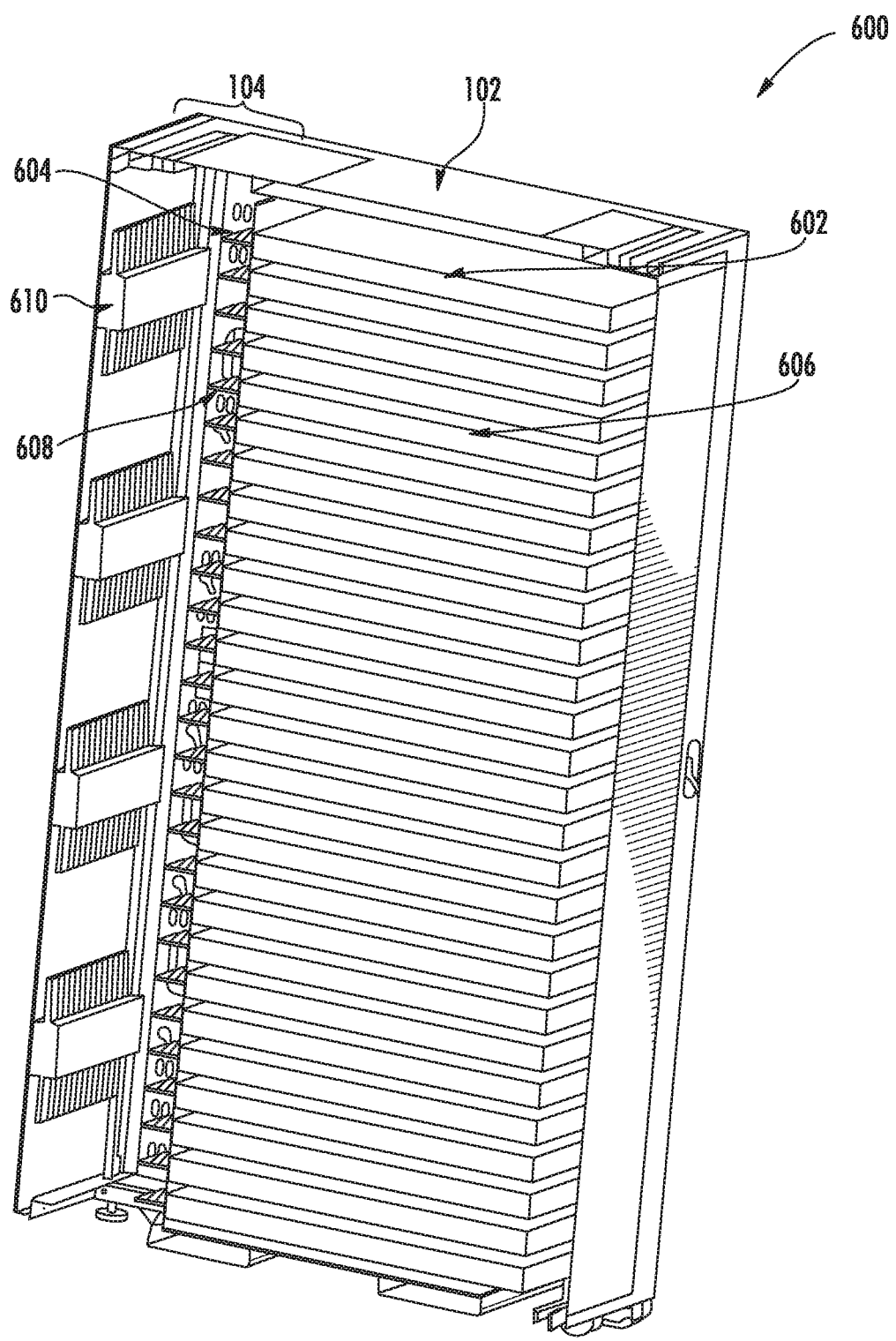
FIG. 6 is a perspective cut away view of an internally wireless datacenter rack including wireless antennas according to an example embodiment.
Figure 7:
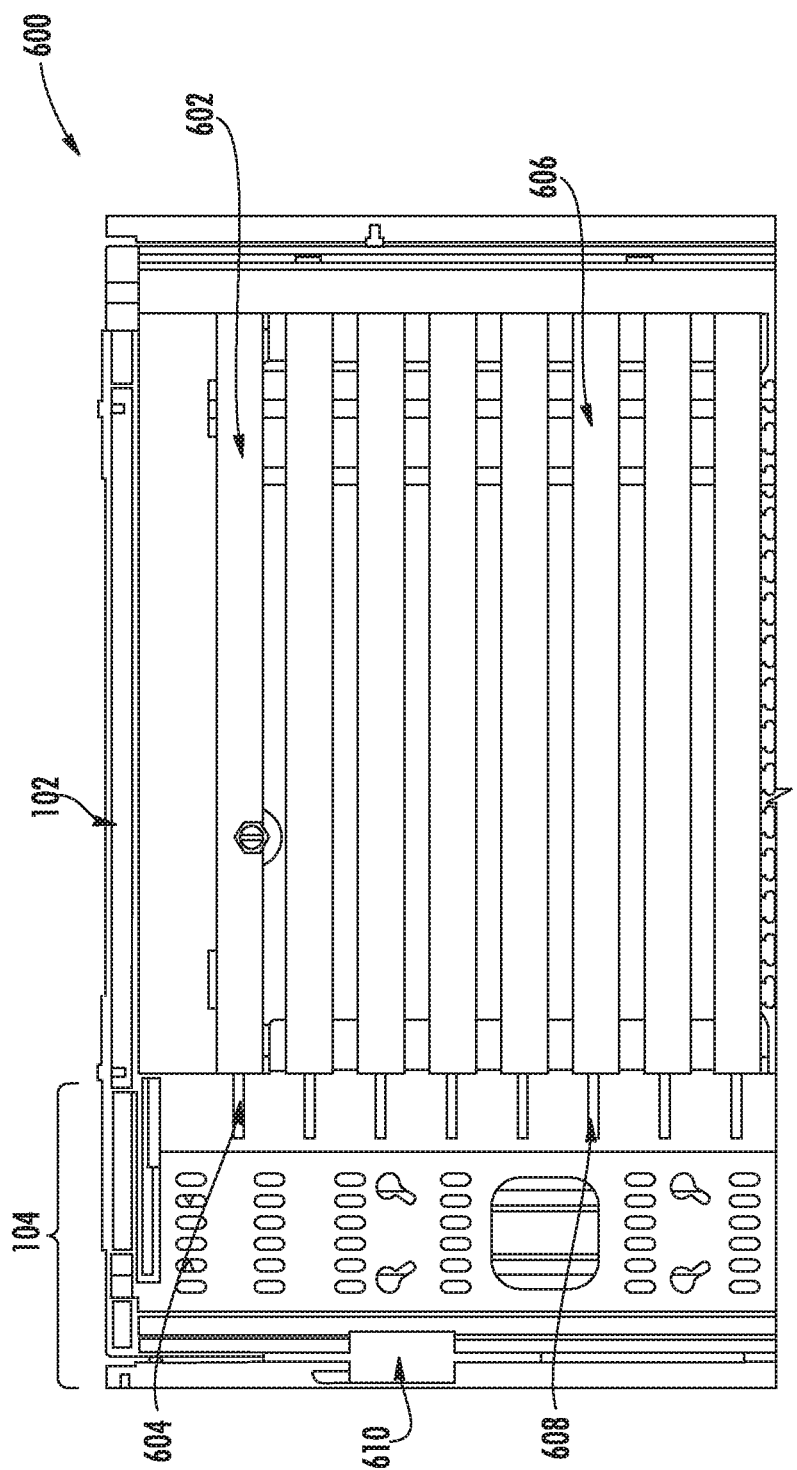
FIG. 7 is a side cut away section view of the internally wireless datacenter rack of FIG. 6 according to an example embodiment.

With reference to FIGS. 6-7, an internally wireless datacenter rack including one or more wireless antennas (e.g., rack 600) is illustrated. The rack 600 may similarly include a first networking box 602 and a second networking box 606 within the housing 102. As described above with reference to FIGS. 3-5, each networking box may contain various networking and communication elements disposed within each respective networking box. For example, the networking boxes may each include a printed circuit board assembly configured to transmit and receive electrical signals. Each networking box may further include one or more wireless connectors in electrical communication with the printed circuit board assembly of the respective networking box. As shown in FIGS. 6-7, the first networking box 602 may include a first wireless connector 604 that extends into the wireless free space region 104 and the second networking box 406 may include a second wireless connector 608 that extends into the wireless free space region 104. In some embodiments, the one or more wireless connectors may be configured to transmit and receive wireless signals including but not limited to WiFi radio waves, mmWave, and/or THz wireless. Additionally, rack 600 may include one or more free space wireless antennas 610. In some embodiments, the antennas 610 may be located along an interior wall of the housing 102 (e.g., the backplane wall 311 in FIG. 3) opposite the one or more wireless connectors of the networking boxes. For example, the free space wireless antennas 610 may be configured to facilitate wireless communication between the first wireless connector 604 and the second wireless connector 606. In such an example, a wireless signal transmitted by the first wireless connector 604 may be received by a free space wireless connector 610 and properly directed to the second wireless connector 608 by the free space wireless antenna 610.

As described above, the wireless free space region 104 may allow for wireless communication between networking boxes housed by the rack 600. For example, the first networking box 602 may (e.g., via a printed circuit board assembly contained therein) transmit an electrical signal to the first wireless connector 604. The first wireless connector 604 may convert the electrical signal to a corresponding wireless signal (e.g., WiFi radio, mmWave, THz wireless communication) for transmission. The wireless signal may be emitted by the first wireless connector 604 and, via the wireless free space region 104, may then be propagated to the second wireless connector 608. Similarly, the second wireless connector 608 may convert the wireless signal that is received to a corresponding electrical signal for use by the second networking box 606. Although described in reference to wireless communication between two networking boxes via corresponding wireless connectors, the present disclosure contemplates that any wireless connector may be configured to be in wireless communication with any other wireless connector associated with the rack 600. Furthermore, the present disclosure also contemplates that each wireless connector may be simultaneously transmitting and/or receiving wireless signals from one or more other wireless connectors associated with the rack 600. Said another way, rack 600 may be configured such that any networking box, via a wireless connector, may communicate with any other networking box within the rack 600. To be clear, the present disclosure does not preclude wired connection by the embodiments described herein, but instead provides for wireless solutions which may be used by datacenter racks with or without wired connections.

Figure 8:
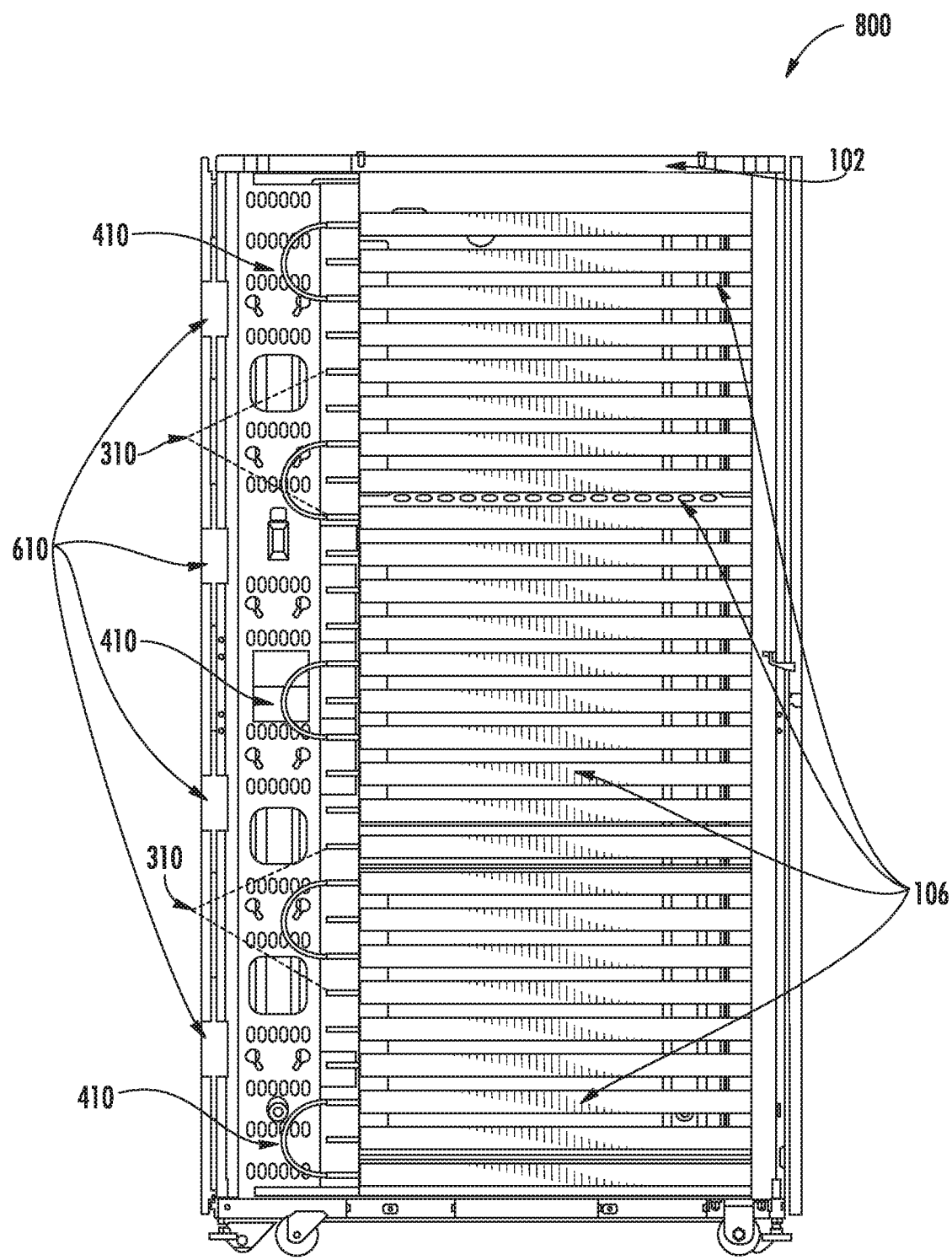
FIG. 8 is a side cut away view of the internally wireless datacenter rack including a wireless reflective backplane, wireless waveguides, and wireless antennas according to an example embodiment.

With reference to FIG. 8, an internally wireless datacenter rack 800 is illustrated including a wireless reflective backplane, one or more wireless waveguides, and one or more wireless antennas. As illustrated by FIG. 8, the present disclosure contemplates that any portion or combination of the embodiments for an internally wireless datacenter rack (e.g., racks 300, 400, 600) may be incorporated into a single internally wireless datacenter rack 800.

With any of the embodiments described herein, the present disclosure contemplates that one or more transceiver assemblies may be used by the networking boxes, wireless connectors, or the like for converting between optical and electrical signals. Further, the present disclosure contemplates that any of the embodiments described herein may include networking boxes comprising board-to-board connectors such that wired communication (e.g., via Quad Small Form-factor Pluggable (QSFP), Small Form Pluggable (SFP), C-Form-factor Pluggable (CFP), Double Density Form-factor Pluggable (DDQSFP), Octal Small Form-factor Pluggable (OSFP), or any passive or active Optical cable) or a combination of wired and wireless communication may be used by any datacenter rack embodiment.

Many modifications and other embodiments of the inventions set forth herein will come to mind to one skilled in the art to which these inventions pertain having the benefit of teachings presented in the foregoing descriptions and the associated drawings. Although the figures only show certain components of the apparatus and systems described herein, it is understood that various other components (e.g., components of printed circuit boards, transceivers, etc.) may be used in conjunction with the optical connector cage. Therefore, it is to be understood that the inventions are not to be limited to the specific embodiments disclosed and that modifications and other embodiments are intended to be included within the scope of the appended claims.

What is claimed is:

1. An internally wireless datacenter rack configured to support datacenter computing equipment, the datacenter rack comprising:
   a housing configured to receive at least:
      a first networking box comprising a printed circuit board assembly, and one or more wireless connectors in electrical communication with the printed circuit board assembly, wherein the one or more wireless connectors are configured to convert between electrical signals and wireless signals and are configured to transmit and receive wireless signals, and
      a second networking box comprising a printed circuit board assembly, and one or more wireless connectors in electrical communication with the printed circuit board assembly, wherein the one or more wireless connectors are configured to convert between electrical signals and wireless signals and are configured to transmit and receive wireless signals; and
   a wireless free space region disposed within the housing, the wireless free space region comprising:
      a wireless reflective backplane configured to allow free space wireless communication, wherein the wireless reflective backplane is configured to reflect wireless signals between the one or more wireless connectors disposed on the first networking box and the one or more wireless connectors disposed on the second networking box,
      wherein the housing further defines a backplane wall and at least one support wall located within the housing, wherein in an instance in which the first and second networking boxes are received within the housing, the support wall is located a first distance from a first end of the first networking box and a first end of the second networking box, and the backplane wall is located a second distance from a second end of the first networking box and a second end of the second networking box, wherein the second distance is larger than the first distance.

2. The internally wireless datacenter rack of claim 1, wherein, in an instance in which the first and second networking boxes are received within the housing, the wireless free space region is disposed adjacent the one or more wireless connectors.

3. The internally wireless datacenter rack of claim 1, wherein the wireless reflective backplane is disposed on the backplane wall of the housing.

4. The internally wireless datacenter rack of claim 1, wherein the one or more wireless connectors of the first networking box and the one or more wireless connectors of the second networking box further comprise one or more transceiver assemblies configured to convert between optical signals and electrical signals.

5. The internally wireless datacenter rack of claim 1, wherein the first networking box and the second networking box are vertically aligned.

6. The internally wireless datacenter rack of claim 1, further comprising a backplane wall, wherein the backplane wall is an exterior wall of the housing.

7. The internally wireless datacenter rack of claim 6, wherein the wireless reflective backplane is disposed on an interior surface of the backplane wall of the housing.

* * * * *